(12) United States Patent
Bohnert et al.

(10) Patent No.: US 7,046,867 B2
(45) Date of Patent: May 16, 2006

(54) FIBEROPTIC CURRENT SENSOR HAVING A PLURALITY OF SENSOR HEADS

(75) Inventors: Klaus Bohnert, Oberrohrdorf (CH); Philippe Gabus, Nussbaumen (CH); Hubert Brandle, Oberengstringen (CH)

(73) Assignee: ABB Research LTD, Zurich (CH)

( * ) Notice: Subject to any disclaimer, the term of this patent is extended or adjusted under 35 U.S.C. 154(b) by 0 days.

(21) Appl. No.: 10/777,403

(22) Filed: Feb. 13, 2004

(65) Prior Publication Data

US 2004/0160608 A1 Aug. 19, 2004

Related U.S. Application Data

(60) Provisional application No. 60/447,294, filed on Feb. 14, 2003.

(51) Int. Cl.
*G02B 6/00* (2006.01)
(52) U.S. Cl. .............................. 385/12; 385/13; 385/14
(58) Field of Classification Search .................. 385/12, 385/13, 14, 15, 19
See application file for complete search history.

(56) References Cited

U.S. PATENT DOCUMENTS

| 4,814,930 | A | | 3/1989 | Abe et al. | |
|---|---|---|---|---|---|
| 5,450,006 | A | * | 9/1995 | Tatam | ........................ 324/96 |
| 5,991,479 | A | * | 11/1999 | Kleinerman | ................. 385/31 |
| 6,542,651 | B1 | * | 4/2003 | Bennett | ........................ 385/12 |
| 6,563,589 | B1 | * | 5/2003 | Bennett et al. | ............. 356/483 |
| 6,763,153 | B1 | * | 7/2004 | Bennett | ........................ 385/12 |

FOREIGN PATENT DOCUMENTS

| DE | EP1139105 | * | 3/2001 |
|---|---|---|---|
| EP | 1 154 278 A2 | | 11/2001 |
| EP | 1 154 278 A3 | | 11/2001 |
| EP | 1 245 961 A2 | | 10/2002 |
| EP | 1 245 961 A3 | | 10/2002 |

OTHER PUBLICATIONS

J. Blake et al., "In-Line Sagnac Interferometer Current Sensor", IEEE Transactions on Power Delivery, vol. 11, No. 1, Jan. 1996, pp. 116-121.
Guido Frosio et al., "Reciprocal Reflection Interferometer For A Fiber-Optic Faraday Current Sensor", Applied Optics, vol. 33, No. 25, Sep. 1, 1994, pp. 6111-6122.

* cited by examiner

*Primary Examiner*—Kaveh Kianni
(74) *Attorney, Agent, or Firm*—Buchanan Ingersoll PC

(57) ABSTRACT

The invention relates to a fiberoptic current or magnetic field sensor having a plurality of sensor heads, and to a corresponding measurement method. The sensor has a light source: $N \geq 2$ sensor heads; at least one phase modulation unit; a detector; a control and evaluation unit. The at least one phase modulation unit is connected to at least one of the sensor heads. Lightwaves can be differentially phase-modulated in a non-reciprocal fashion by means of the at least one phase modulation unit. Modulation amplitudes $\phi_{0,n}$ and modulation frequencies $v_n$ are selected as a function of modulation-relevant optical path lengths $l_n$.

12 Claims, 7 Drawing Sheets

FIBEROPTIC CURRENT SENSOR HAVING A PLURALITY OF SENSOR HEADS

This non-provisional application claims priority under 35 U.S.C. §119(e) from Provisional Patent Application No. 60/447,294 filed on Feb. 14, 2003, which is herein incorporated by reference.

TECHNICAL FIELD

The invention relates to the field of fiberoptic sensors. It relates to a fiberoptic sensor for measuring current or magnetic field in accordance with the preamble of patent claim 1, and to a method for measuring an electric current or magnetic field in accordance with the preamble of patent claim 12.

PRIOR ART

Such a current sensor is known, for example, from EP 1 154 278 A2. This sensor has a light source, a detector, a signal processor and in addition a modulator circuit and two sensor heads. Light is coupled from the light source into the modulator circuit and propagates from there into the two sensor heads. Such a sensor head includes a magnetooptically active sensor fiber, which is arranged in the shape of a coil around an electric conductor in which the electric current to be measured flows. The Faraday effect thereby produces a differential phase shift between two mutually orthogonally polarized lightwaves propagating in such a sensor head.

The sensor heads in each case have a mirrored end such that, together with the remainder of the optical structure, they each form a reflection interferometer. After the reflection at the mirrored ends, the light is guided back through the modulator circuit and coupled into the detector. The signal processor evaluates the signals of the detector. The modulator circuit has an end on the side of the light source and detector, and an end on the side of the sensor head. It serves the purpose of the non-reciprocal modulation of a differential phase of two lightwaves that propagate in opposite directions and are polarized parallel to one another. For this purpose, the modulator circuit includes a piezoelectric phase modulator that is operated with its resonant frequency and is controlled by the signal processor.

The non-reciprocal differential phase modulation achieved by means of the modulator circuit serves the purpose of achieving a higher resolution in the detection of the differential phase shift induced by the Faraday effect. The effective operating point of the interferometer is shifted in a linear region of the cosinusoidal interference function.

A time division multiplexing method is used in order to be able to distinguish in the signal processor between the signals originating from the two different sensor heads. The light source is operated in a pulsed fashion, and the lengths of the two reflection interferometers are selected to be of different magnitudes. This produces transit times of different length for signals (or lightwaves) that originate from the various sensor heads, and so these signals arrive at various times in the signal processor and can thereby be distinguished.

A disadvantage of this type of sensor is that the achievable signal-to-noise ratio is not optimum, because a signal is not generated continuously at the detector, but only during a fraction of the measuring time, because of the pulsed operation. A further disadvantage is that owing to the different lengths of the two reflection interferometers, the amplitude with which the phase modulator is operated can be optimally selected only for one of the two sensor fibers.

Another current sensor is known from G. Frosio, R. Dändliker, "Reciprocal Reflection Interferometer for a Fiber-Optic Faraday Current Sensor", *Appl. Opt.* 33, 6111 (1994). This likewise has a reflection geometry, but includes only one sensor head. In order to produce a non-reciprocal differential phase modulation, this sensor likewise has a piezoelectric phase modulator. The latter is not arranged in a modulator circuit. It modulates the differential phase of two mutually orthogonally polarized lightwaves propagating in the same direction. Substantially larger driver voltages are required at the piezomaterial of the modulator, since a direct modulation of the birefringence of the fiber of the modulator must be produced.

J. Blake, P. Tantaswadi, and R. T. de Carvalho disclose in FIG. 1 of the publication "In-line Sagnac Interferometer Current Sensor", *IEEE Transactions on Power Delivery*, 11, 116–121 (1996) a further current sensor. This sensor has a Sagnac geometry and includes only one sensor head. Like the sensor described by Frosio and Dändliker, it is also necessary here for a large driver voltage to be present at the piezomaterial of the modulator, since the differential phase of two mutually orthogonally polarized lightwaves propagating in the same direction is modulated by means of direct modulation of the birefringence.

SUMMARY OF THE INVENTION

It is an object of the present invention to create a current sensor of the type mentioned at the beginning, and a corresponding measurement method, it be aimed not to give rise to the above named disadvantages. The aim, in particular, is for the sensor to have an improved signal-to-noise ratio.

This object is achieved by a fiberoptic current sensor having the features of patent claim 1, and a corresponding measurement method in accordance with patent claim 12.

The fiberoptic sensor according to the invention for measuring at least one electric current or magnetic field has: a light source; N sensor heads that can be arranged in the shape of a coil around current conductors or along the magnetic field, N being a whole number with $N \geq 2$; at least one phase modulation unit having at least one phase modulator; at least one detector; and a control and evaluation unit that is connected via at least one detector signal line to the at least one detector, and via at least one modulator signal line to the at least one phase modulator. In this case, first means are available for guiding light from the light source into an end, on the detector side, of the phase modulation unit, and second means are available for guiding light from the end, on the detector side, of the phase modulation unit to the detector, and the at least one phase modulation unit has one further end, on the sensor head side, which is optically connected to at least one of the sensor heads, and linearly polarized lightwaves can be phase-modulated differentially in a non-reciprocal fashion by means of the at least one phase modulation unit.

The sensor is distinguished by virtue of the fact that N modulation amplitudes $\phi_{0,n}$ and N modulation frequencies $v_n$ are provided for the non-reciprocal differential phase modulations, the modulation frequencies $v_n$ and two prescribable positive whole numbers p, q with $p \neq q$ being selected in such a way that it holds for all positive whole numbers z and for all whole numbers n, m with $n \neq m$ and $1 \leq n, m \leq N$ that:

$p \cdot v_n \neq z \cdot v_m$ and $q \cdot v_n \neq z \cdot v_m$, and the modulation amplitudes $\phi_{0,n}$ and the modulation frequencies $v_n$ being selected as a function of modulation-relevant optical path lengths $l_n$.

Thus, N different modulation frequencies $v_n$ are used for the non-reciprocal modulation of the differential phase of the lightwaves in the case of a sensor comprising N sensor heads. These modulation frequencies $v_n$ and two positive whole numbers p and q are selected in such a way that a p-fold and a q-fold multiple of each of the modulation frequencies $v_n$ differs from all the harmonics of each of the other modulation frequencies $v_n$. Moreover, the modulation amplitudes $\phi_{0,n}$ and the modulation frequencies $v_n$ are selected as a function of modulation-relevant optical path lengths $l_n$. These modulation-relevant optical path lengths $l_n$ are essentially the optical path lengths which lightwaves traverse from the at least one phase modulator through the $n^{th}$ sensor head and back to the same at least one phase modulator. Corrections that are to be added to this optical path length, for example in the case of modulator circuits with fiber branches of different length as phase modulation units, are specified further below in the description.

It is advantageous that on the basis of such a design it is possible, on the one hand, for the signals that originate from various sensor heads to be uniquely assigned via their frequency to the appropriate sensor head on the basis of the conditions for the modulation frequencies $v_n$. On the other hand, the modulation amplitudes $\phi_{0,n}$ and the modulation frequencies $v_n$ can be selected in such a way that it is possible to set an optimum detectability and an optimum signal-to-noise ratio for each of the N sensor heads.

It is advantageous to select p=1 and q=2 such that signals of the first and second harmonics are detected and evaluated. The detected signals are particularly large thereby, and so the signal-to-noise ratio is optimum.

In an advantageous embodiment of the invention, the sensor has exactly one control and evaluation unit. Signals that originate from the various sensor heads and are fed to the control and evaluation unit via the at least one detector signal line are distinguished from one another in said unit by means of frequency filtering. These signals are converted in the control and evaluation unit into N output signals $S_n$ that are a measure of the at least one current to be measured or of the at least one magnetic field to be measured. In particular, the output signals $S_n$ for each n with $1 \leq n \leq N$ are determined from signals at the frequencies $p \cdot v_n$ and $q \cdot v_n$ in the control and evaluation unit. The detection can take place in an open-loop or in a closed-loop method. It is possible on the basis of the assignment of the signals to the sensor heads in terms of frequency to use a single control and evaluation unit to evaluate signals from all sensor heads, the result being to implement a very cost effective and simple sensor.

A further advantageous embodiment of the invention is characterized in that it contains exactly one phase modulation unit. A very cost effective and simple design is thereby implemented. The sensor has N reflection interferometers, each of the N reflection interferometers including exactly one of the N sensor heads, and the N sensor heads in each case having a mirrored end. Such a sensor is insensitive to disturbances such as vibrations and is easy to produce. Moreover, it is possible to provide inherent temperature compensation such as is known from the prior art. The light source of such a sensor is advantageously operated in a pulsed fashion, and the detection is performed by means of a time division multiplexing method. The sensor therefore manages with a minimum of requisite components.

In the case of such a sensor, the phase modulation unit is advantageously either a modulator circuit having N phase modulators that are operated in each case with one of the N modulation frequencies $v_n$, or the phase modulation unit is a single phase modulator that permits a simultaneous phase modulation with the N various modulation frequencies $v_n$, that is to say is operated with a frequency spectrum of the N modulation frequencies $v_n$.

Another advantageous embodiment of the invention has N phase modulation units having one phase modulator each, the nth phase modulation unit being optically connected to the nth sensor head, and the nth phase modulator being operated with the modulation frequency $v_n$. Such a sensor can be operated without a time division multiplexing method, and so the light source can be operated continuously (in continuous wave mode). This results in an improved signal-to-noise ratio.

Such a sensor is advantageously designed in such a way that N reflection interferometers are provided, each of the N reflection interferometers including exactly one of the N sensor heads, and the N sensor heads in each case having a mirrored end, and that either the phase modulation units are modulator circuits, the differential phase of oppositely directed lightwaves polarized parallel to one another being modulated by the phase modulators, or that the differential phase of lightwaves propagating in the same direction and mutually orthogonally polarized is modulated by each of the phase modulators, for example by means of integrated optical modulators.

A corresponding sensor can also be designed with a Sagnac configuration.

An advantageous sensor according to the invention is advantageously operated with p=1 and q=2, the N modulation amplitudes $\phi_{0,n}$ and the N modulation frequencies $v_n$ being selected in such a way that amplitudes $\alpha_{0,n}$ of the modulation of the differential phase of the linearly polarized lightwaves lie between 1.7 and 2.0, in particular between 1.8 and 1.88, or are essentially 1.84 for all n with $1 \leq n \leq N$. This results in maximum signals and an optimum signal-to-noise ratio.

In the method according to the invention for measuring at least one electric current or at least one magnetic field, a light source emits lightwaves that are converted into linearly polarized lightwaves. The linearly polarized lightwaves are guided into N sensor heads in which the lightwaves undergo a phase shift dependent on the current or magnetic field to be measured, N being a whole number with $N \geq 2$. The lightwaves undergo a non-reciprocal differential phase modulation in at least one phase modulation unit with at least one phase modulator, and are detected in at least one detector. The at least one phase modulation unit is traversed by the lightwaves both during their propagation from the light source to the sensor heads, and during their propagation from the sensor heads to the at least one detector. A control and evaluation unit is used, on the one hand, to control the at least one phase modulator and, on the other hand, also to evaluate signals originating from the at least one detector.

The method is characterized in that the lightwaves are differentially phase-modulated in a non-reciprocal fashion with N modulation amplitudes $\phi_{0,n}$ and N modulation frequencies $v_n$. In this case, the modulation frequencies $v_n$ and two prescribable positive whole numbers p, q with $p \neq q$ are selected in such a way that it holds for all positive whole numbers z and for all whole numbers n, m with $n \neq m$ and $1 \leq n, m \leq N$ that:

$p \cdot v_n \neq z \cdot v_m$ and $q \cdot v_n \neq z \cdot v_m$.

The modulation amplitudes $\phi_{0,n}$ and the modulation frequencies $v_n$ are advantageously selected as a function of modulation-relevant optical path lengths $l_n$.

Signals of the pth and qth harmonics of the N modulation frequencies $v_n$ are detected, preferably by means of frequency filtering. The modulation frequencies $v_n$ are selected in such a way that these pth and the qth harmonics are different from other signal frequencies occurring, in particular from the other harmonics of the modulation frequencies $v_n$. This permits the signals to be uniquely assigned via their frequency to the corresponding sensor head. Moreover, the selection of the various modulation frequencies $v_n$ for the various sensor heads, together with a corresponding selection of the modulation amplitudes $\phi_{0,n}$ of the non-reciprocal differential phase shifts as a function of modulation-relevant optical path lengths $l_n$ permits optimum tuning of these values for each of the sensor heads such that it is possible to set an optimum detectability and an optimum signal-to-noise ratio.

Further preferred embodiments and advantages follow from the dependent patent claims and the figures.

BRIEF DESCRIPTION OF THE DRAWINGS

The subject matter of the invention is explained in more detail below with the aid of preferred exemplary embodiments that are illustrated in the attached drawings, in which.

Figure 1:
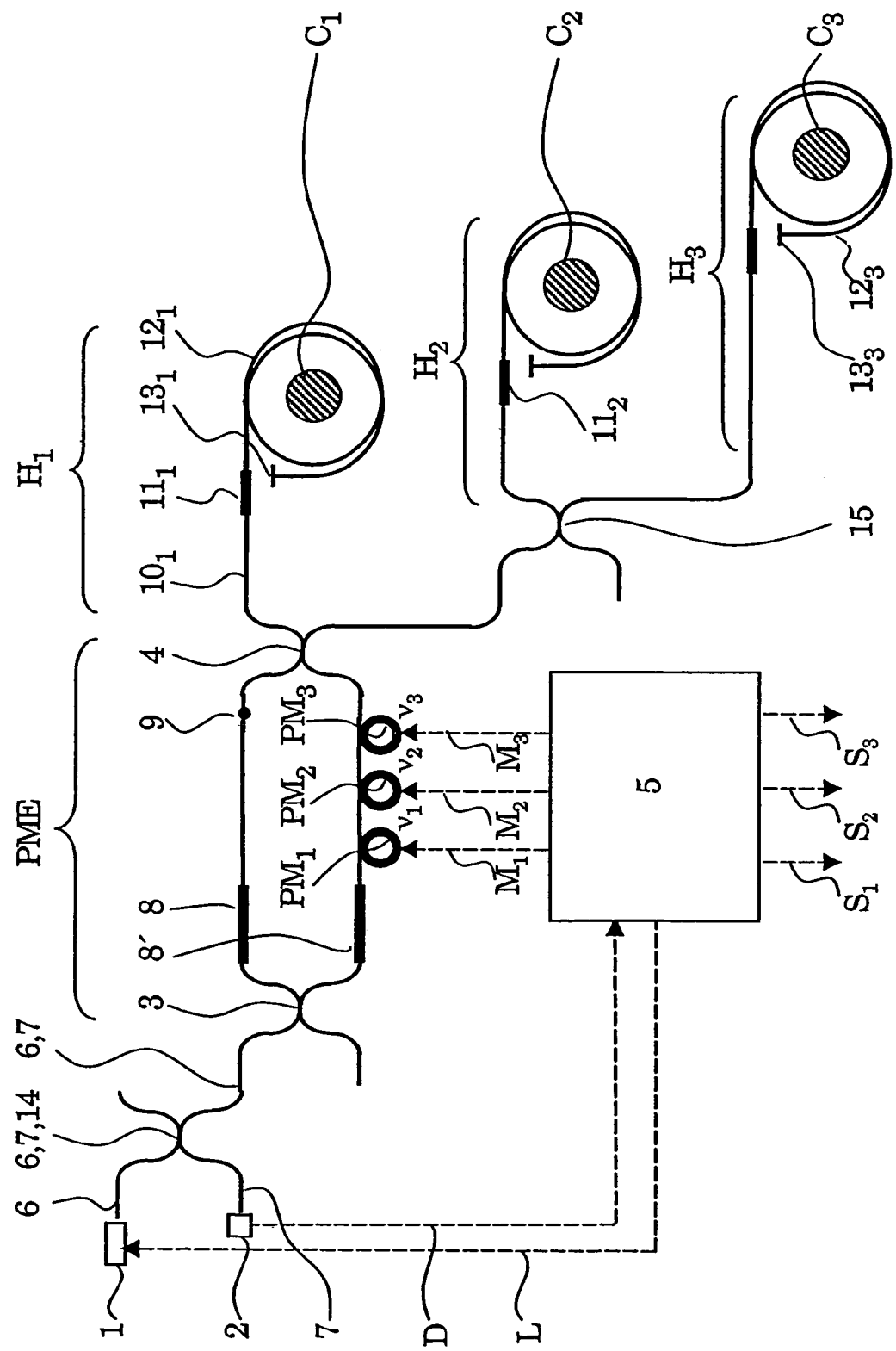
FIG. 1 shows schematically a sensor in reflex configuration, having a modulator circuit, three phase modulators and three sensor heads.

The reference symbols used in the drawings, and their meaning, are listed in summary in the list of reference symbols. Identical, or at least identically acting parts are basically provided in the figures with identical reference symbols. The exemplary embodiments described represent the subject matter of the invention by way of example and are not restrictive.

WAYS OF IMPLEMENTING THE INVENTION

A few details known from the prior art and relating to the design of similar sensors and to the generation of non-reciprocal differential phase modulations are not illustrated below and can be taken from the abovementioned EP 1 154 278 A2, which is therefore hereby incorporated into the description together with its entire disclosure content.

An embodiment of the invention is illustrated in FIG. 1. A superluminescence diode 1 serving as low coherence light source 1 emits lightwaves in a first means 6 for guiding light of the light source 1 into an end 3, on the detector side, of a phase modulation unit PME. This first means 6 essentially comprises a fiber coupler 14 and, if appropriate, additionally one or two further fiber-pieces by means of which the light source 1 and the phase modulation unit PME are optically connected to opposite sides of the fiber coupler 14.

The light source 1 is advantageously a low coherence light source, for example a luminescence diode, a superluminescence diode or a laser diode operated below the laser threshold. The coherent lengths are then typically of the order of magnitude of 50 μm. Another possible light source 1 is a broadband fiber source, for example an erbium-doped fiber that can advantageously be pumped by a semiconductor laser with an emission wavelength of 980 nm or 1480 nm for example.

Serving as phase modulation unit PME in FIG. 1 is a modulator circuit PME. The latter has an end 3 on the detector side, and an end 4 on the sensor head side. These two ends 3, 4 are formed by fiber couplers 3, 4. The modulator circuit PME has two fiber branches between the two ends 3, 4. A polarizer 8 or 8', respectively, is arranged in each of the two fiber branches. A 90° splice 9 is arranged as means for changing the direction of polarization 9 in one of the fiber branches. N=3 piezoelectric phase modulators $PM_1$, $PM_2$, $PM_3$ are arranged one behind another in the other fiber branch. N is the number of the sensor heads $H_1$, $H_2$, $H_3$ of the sensor. The first sensor head $H_1$ is provided at an output of the coupler 4 on the sensor head side. Provided at the other output of the coupler 4 on the sensor head side is a fiber coupler 15 to whose two outputs the further two sensor heads $H_2$, $H_3$ are connected.

The three sensor heads $H_1$, $H_2$, $H_3$ are of similar design. They have one optional fiberoptic supply lead $10_1, 10_2, 10_3$, each, one phase delay element $11_1, 11_2, 11_3$ each, and one sensor coil $12_1, 12_2, 12_3$ each. For the sake of clarity, $10_n$, $11_n$ etc are described below. For the sake of clarity, some reference symbols that follow from the remainder of the figure or in conjunction with the other figures are not used in the figures. The phase delay element $11_n$ is a λ/4 element that generates a 90° phase delay, or else another phase delay, typically lying near 90°. It connects the fiberoptic supply lead $10_n$ to one end of the sensor coil $12_n$. The sensor coil $12_n$ comprises a magnetooptically active fiber $12_n$, preferably having a round core cross section. The other end $13_n$ of the sensor coil $12_n$ is mirrored, or has a mirror $13_n$. Each sensor head $H_n$ is arranged in the shape of a coil around a current conductor $C_n$ in which an electric current $1_{el,n}$ to be measured flows.

After a reflection at a mirrored end $13_n$, the lightwaves return again. Starting from the end 3, on the detector side, of the phase modulation unit PME, the light is guided from the end 3, on the detector side, of the phase modulation unit PME to a detector 2 via a second means 7 for guiding light.

The detector 2 is a photodetector, for example a photodiode or photomultiplier.

The sensor also has a control and evaluation unit 5 that includes a signal processor. The control and evaluation unit 5 is connected to the detector 2 via a detector signal line D, and to each of the three phase modulators $PM_n$ via three modulator signal lines $M_n$. Moreover, the control and evaluation unit 5 is also connected to the light source 1 via a light control signal line L. The control and evaluation unit 5 evaluates the signals, originating from the detector 2, in output signals $S_n$ that are a measure of the magnitude of the electric currents $I_{el,n}$ or magnetic fields to be measured.

The optical elements arranged between the polarizers 8, 8' and the phase delay elements 11$_n$ are polarization maintaining. These are advantageously optical fibers having an elliptic core cross section. The optical elements arranged between the polarizers 8, 8' and the light source 1 and the detector 2, respectively, are advantageously also polarization maintaining. This also holds for the other embodiments of the invention.

The light emitted by the light source 1 is split between the two fiber branches of the modulator circuit at the coupler 3, preferably in the ratio of intensity 1:1. The light is linearly polarized in the polarizers 8,8'. Mutually orthogonally polarized lightwaves then pass into the coupler 4 because of the 90° splice 9. In the 90° phase delay element 11$_n$, the mutually orthogonally polarized lightwaves are converted into left and right circularly polarized lightwaves. Because of the magnetic field of the current to be measured, said lightwaves undergo phase shifts of different magnitude in the sensor coil 12$_n$. After reflection at the mirrored end 13$_n$, the circularly polarized lightwaves are reconverted into mutually orthogonally polarized lightwaves during the second traverse of the 90° phase delay element 11$_n$. Because of the non-reciprocal Faraday effect, these converted lightwaves have a differential phase shift of $$\Delta\phi_n = 4 \cdot V_n \cdot R_n \cdot I_{el,n}.$$

Here, $V_n$ is the Verdet constant of the material of a sensor coil 12$_n$ (for example $2.65 \cdot 10^{-3}$ Rad/A at 820 nm light wavelength); $R_n$ is the number of turns of the sensor coil about a current conductor; $I_{el,n}$ is the current to be measured, which flows in the current conductor $C_n$. The fact that the phase shift is non-reciprocal means that it accumulates and is not cancelled by the twofold traverse of the sensor coil 12$_n$ (once in the opposite direction in each case).

Elliptically polarized light instead of circularly polarized light results when the phase delay elements 11$_n$ do not produce a phase shift of exactly 90°. This results in corresponding corrections by comparison with the specified equation for $\Delta\phi_n$, and these are known from the prior art.

The non-reciprocally phase shifted, mutually orthogonally polarized lightwaves traverse the phase modulation unit PME. The light is transmitted from the end 3, on the detector side, of the phase modulation unit PME to the detector 2 via the second means 7 for guiding light. The second means 7 is partially identical to the first means 6. It comprises the coupler 14 and, if appropriate, one or two further fiber pieces. A photodiode 2 serves as detector 2. The non-reciprocal phase shift $\Delta\phi$ induced by the Faraday effect is a measure of the magnitude of the electric current to be measured.

The modulator circuit PME serves for the non-reciprocal modulation of a differential phase of two lightwaves propagating in opposite directions and polarized parallel to one another. The effective operating point of the interferometer is thereby displaced in a linear region of the cosinusoidal interference function. A greater resolution in the detection of the differential phase shift $\Delta\phi$ induced by the Faraday effect is achieved in this way.

The modulator circuit PME includes three preferably piezoelectric phase modulators $PM_1, PM_2, PM_3$ in accordance with the number N of sensor heads $H_n$. A piezoelectric phase modulator essentially comprises a piece of piezoelectric material and a piece of optical fiber that is wound around the piezoelectric material. Each of the phase modulators $PM_n$ is advantageously operated at its resonant frequency.

Owing to the operation at the resonant frequency, relatively low driver voltages can already suffice to generate a large phase modulation amplitude $\phi_{o,n}$ for the individual lightwaves. The amplitudes of the differential phase shift between the two lightwaves propagating in opposite directions and polarized parallel to one another may be taken as $\alpha_{0,n}$. The frequencies of the modulations may be taken as $v_n$. The signal at the photodiode 2 is then modulated with the modulation frequencies $v_n$ and their harmonics.

The first step is to consider the case in which modulation is performed with the aid of a phase modulator $PM_n$ and a single modulation frequency $v_n$, and there is one sensor head $H_n$, that is to say N=1 and n=1:

For Faraday phase shifts $\Delta\phi_n < 90°$, $\Delta\phi_n$ can be determined from the amplitudes $I_{Det,vn} = I_0 \cdot J_1(\alpha_{0,n}) \cdot \sin \Delta\phi_n$ of the photodiode signals of the first harmonic $v_n$ and, respectively, $I_{Det,2vn} = I_{0,n} \cdot J_2(\alpha_{0,n}) \cdot \cos \Delta\phi_n$ of the second harmonic $2 \cdot v_n$ in accordance with $$\Delta\phi_n = \arctan\{[I_{Det,vn}/I_{Det,2vn}] \cdot [J_2(\alpha_{0,n})/J_1(\alpha_{0,n})]\},$$

$I_{0,n}$ being constant, in general unknown light amplitudes, and $J_1$ and $J_2$ being the Bessel functions of first and second order, respectively.

It holds approximately for small Faraday phase shifts $\Delta\phi_n$ with $\Delta\phi_n \ll 1$ (in radians) that $$\Delta\phi_n = [I_{Det,vn}/I_{Det,2vn}] \cdot [J_2(\alpha_{0,n})/J_1(\alpha_{0,n})].$$

The type of signal detection and evaluation described is a so-called open-loop detection. Closed-loop detection exists as an alternative to the open-loop detection. In the closed-loop detection, $\Delta\phi_n$ is compensated at the phase modulator $PM_n$ by applying an appropriate control signal. For this purpose, an amplitude of the photodiode signal is controlled to zero, preferably at the first harmonic, that is to say at $I_{Det,vn}$. The magnitude of the control signal is a measure of $\Delta\phi_n$ and of the current $I_{el,n}$ to be measured.

The modulation amplitudes $\alpha_{0,n}$ of the differential phases are given by $$\alpha_{0,n} = 2 \cdot \phi_{0,n} \cdot \sin(2\pi v_n T_n/2),$$

$T_n$ being the modulation-relevant circulation time of the light. $T_n$ is given as $T_n = l_n/c$ with the modulation-relevant optical path length $l_n$ and the speed of light vacuum c. The optical path length is the product of the geometric path length and the effective refractive index. When the optical design is configured in such a way that a lightwave is modulated in the nth phase modulator $PM_n$ both before traversing the nth sensor head $H_n$ and after traversing the nth sensor head $H_n$, $T_n$ is the time required by a lightwave when it runs from the nth modulator $PM_n$ as far as through the nth sensor head $H_n$ and back again to the nth modulator $PM_n$. $l_n$ is the corresponding optical path length. In the case of a reflective design having a modulator circuit $PME_n$ that includes a phase modulator $PM_n$ and whose fiber branches both have the same optical length, the modulation-relevant circulation time $T_n$ is twice the time required by a lightwave when it runs from the phase modulator $PM_n$ as far as the mirror 13$_n$ of the sensor head $H_n$ (a wave that was phase-modulated on the outward path runs on the return path through the fiber branch of the phase modulation unit that does not include the phase modulator). Correspondingly $l_n$ is then twice the optical path length from the phase modulator $PM_n$ up to the mirror 13$_n$ of the sensor head $H_n$. In the case where the modulator circuit $PME_n$ has two fiber branches of different length, in order to maintain $l_n$ it is necessary further to add to this optical path length that optical difference path length by which the second fiber branch is longer than the first fiber branch, which includes the phase modulator $PM_n$. This difference path length is to be added on is negative when the second fiber branch is shorter than that containing the phase modulator $PM_n$. The modulation-relevant circulation time $T_n$ behaves correspondingly in the case of fiber branches of different length: a further (positive or negative) difference time must be added on for the said difference path length at twice the time required by a lightwave from the phase modulator $PM_n$ up to the mirror $13_n$ of the sensor head $H_n$.

For a given driver voltage of a phase modulator $PM_n$ and an amplitude $\phi_{0,n}$, resulting therefrom, of the phase modulation, in accordance with the above equation $\alpha_{0,n}$ is a maximum for $$l_n = (2p-1) \cdot c/(2v_n),$$

with $p=1, 2, 3 \ldots$. By contrast, $\alpha_{0,n}$ vanishes for $$l_n = p \cdot c/(2v_n),$$

with $p=1, 2, 3 \ldots$.

The modulation amplitudes $\phi_{0,n}$ and the modulation frequencies $v_n$ are selected for all n as a function of the respective optical path length $l_n$. In this case, the modulation frequencies $v_n$ are mostly advantageously prescribed by being selected (in the case of piezoelectric phase modulators) as resonant frequency of the corresponding phase modulator $PM_n$.

The following may now be said concerning the case of $N \geq 2$, that is to say a plurality of sensor heads and a plurality of modulation frequencies:

A further boundary condition is added for $N \geq 2$, specifically that lightwaves which have traversed the nth sensor head $H_n$ are incoherent at the detector 2 with lightwaves that have traversed the mth sensor head $H_m$, for $n \neq m$. The corresponding lightwaves are thereby not capable of interference, and so disturbing superpositions and reciprocal influences are avoided. This condition is achieved by appropriate selection of the total optical circulation lengths $\Lambda_n$ covered by lightwaves from the light source 1 through the nth sensor head $H_n$ to the detector 2 (or $2_n$)

Furthermore, the generally substantially stricter condition that the term $(\Lambda_n - \Lambda_m) \cdot \Delta n_{gr}$ is substantially greater than the coherent length of the light source 1 for $n \neq m$ is also advantageously satisfied. In this case, $\Delta n_{gr}$ is the difference between the group refraction indices for the two mutually orthogonal light modes. Satisfying this condition prevents lightwaves that have been produced by undesired mode coupling from leading to disturbing interference signals.

Signals arrive at the detector 2 that are modulated by the nth phase modulator $PM_n$ and come from the mth sensor head $H_m$; $1 \leq n,m \leq N$. In the case of the first harmonic $(v_n)$, such signals $I_{Det,m,vn}$ and in the case of the second harmonic $(2v_n)$ such signals $I_{Det,m,2vn}$, are given by $$I_{Det,m,vn} = J_1(\alpha_{0,n}) \cdot \sin \Delta\phi_m \cdot \sin(2\pi v_n t)$$

$$I_{Det,m,2vn} = J_2(\alpha_{0,n}) \cdot \cos \Delta\phi_m \cdot \sin(4\pi v_n t).$$

The driver voltages of the phase modulators $PM_n$, and thus the phase modulation amplitudes $\phi_{0,n}$ are selected in conjunction with the corresponding modulation frequencies $v_n$ as a function of the optical path lengths $l_m$. In particular, $\phi_{0,n}$ and $v_n$ are preferably selected in such a way that for n=m each of the amplitudes $\alpha_{0,n}$ of the modulation of the differential phase has the value $\alpha_{0,n}=1.84$. The first maximum of the first Bessel function $J_1$ lies at the value 1.84 (in radians). It is possible in this way to achieve an optimum signal-to-noise ratio, specifically for the signals of each of the sensor heads $H_m$. Depending on the optical path lengths, $\alpha_{0,n}$ is generally different from the optimum value (1.84) for $n \neq m$.

The signals $I_{Det,m,vn}$ and $I_{Det,m,2vn}$ at the frequencies $v_n$ and $2 \cdot v_n$, respectively, can be separated from one another in the control and evaluation unit 5 by means of frequency filtering. For this purpose, the modulation frequencies $v_n$ are selected in such a way that $$v_i \neq v_j \text{ and}$$

$$2 \cdot v_i \neq v_j$$

holds, i, j being whole numbers with $i \neq j$ and $1 \leq i, j \leq N$, N denoting the number of sensor heads $H_n$ of the sensor, which are selected as N=3 in the exemplary embodiment of FIG. 1.

It is also possible in principle when determining the Faraday phase shift $\Delta\phi_n$ to operate with other harmonics, for example with the third and fourth ones, as an alternative or in addition to the first and the second harmonics in order to determine the current to be measured. The conditions for the selection of the modulation frequencies $v_n$ are then to be adapted correspondingly such that none of the harmonics used coincide with another frequency or harmonics thereof. By analogy with the above equation, it then therefore holds for all positive whole numbers z that $$p \cdot v_i \neq z \cdot v_j \text{ and}$$

$$q \cdot v_i \neq z \cdot v_j,$$

i, j being whole numbers with $i \neq j$ and $1 \leq i,j \leq N$ and p and q being positive whole numbers different from one another. Detection is then performed for the pth and qth harmonics of the modulation frequencies $v_n$.

Since in a design in accordance with FIG. 1 each lightwave that originates from one of the three sensor heads $H_n$ is modulated with all three phase modulators $PM_n$, it is required to be able to separate these signals from one another in the control and evaluation unit 5, and to assign them to the respective currents to be measured. Use is made for this purpose of a time division multiplexing method by means of which the signals from the various sensor heads $H_n$ can be discriminated temporarily.

Figure 2:
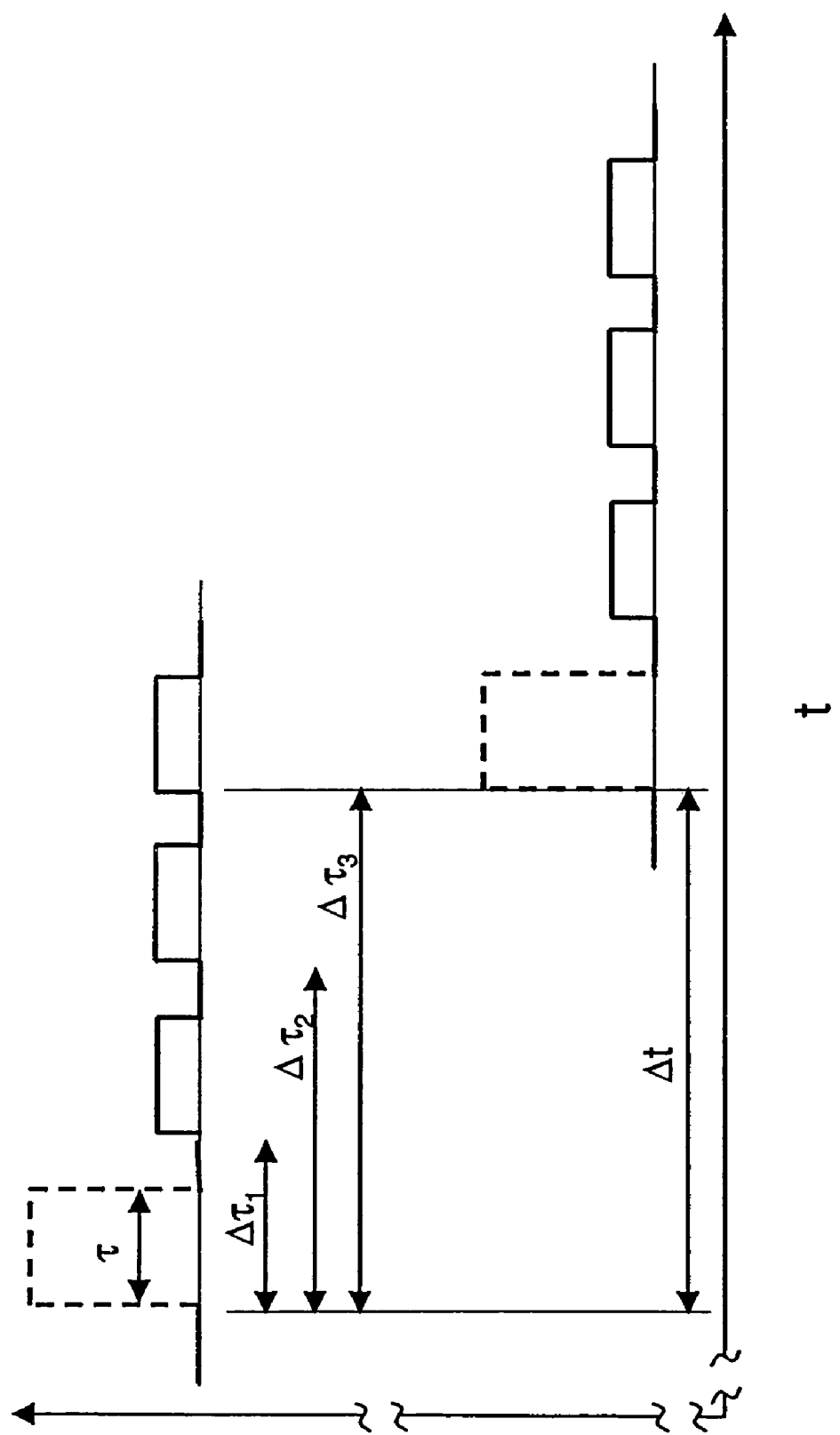
FIG. 2 shows an illustration of the time profile of signals in the case of the time division multiplexing method.

FIG. 2 illustrates the temporal profile of the signals schematically for the exemplary embodiment of FIG. 1. The horizontal axis is the time axis t. The vertical axis illustrates light intensities at the detector 2 (continuous lines) and at the light source 1 (dashed lines). The light source 1 is operated in pulsed fashion with a pulse duration $\tau$ and a pulse spacing $\Delta t$. The control of the light source is performed via the light control signal line L by means of the control and evaluation unit 5. The total optical circulation lengths $\Lambda_n$ that lightwaves cover from the light source 1 through the nth sensor head $H_n$ to the detector 2 are selected in such a way that pulses which traverse various sensor heads are temporarily separated at the photodiode 2. The total circulation lengths $\Lambda_n$ must differ for this purpose from one another by more than $c \cdot \tau$. For a pulse duration of, for example, $\tau=1$ μs, the path length differences (outgoing and returning together) must be greater than approximately 200 m, and be 300 m, for example. The optical path length for the nearest coil, that is to say the smallest $\Lambda_n$, can be smaller than $c \cdot \tau$, however. The interfering optical signals from individual sensor heads $H_n$ then reach the photodiode 2 in corresponding time windows, that is to say spaced apart in time. In the case of N sensor heads, exactly N pulses are recorded with time delays $\Delta\tau_n$, n=1, 2, ... N ($\Delta\tau_n$ being measured from the generation of the light pulse in the light force 1) per light pulse emitted by the light source 1. Each light pulse arriving at the detector includes signals that are modulated with all the modulation frequencies $v_n$ and their harmonics.

FIG. 2 illustrates the case in which the segments are staggered in accordance with $\Lambda_n = n \cdot \Lambda_1$. The path length difference between the nth total circulation lengths $\Lambda_n$ and the (n+1)th path length $\Lambda_{n+1}$ is thus exactly $\Lambda_1$. For $\Lambda_1 = 300$ m, the time delays of the pulses at the detector 2 are then $\Delta\tau_n = n \cdot 1.5$ μs. The temporal spacing $\Delta t$ of the emitted pulse (pulse spacing $\Delta t$) must in this case be at least $\Delta t \geq \tau_N = N \cdot \tau_1$, corresponding to 4.5 μs in the example mentioned and illustrated. It is clear that a pulse duration $\tau$ that is substantially longer than 1 μs entails the disadvantage of very long fiber segments. The path length differences $\Lambda_{n+1} - \Lambda_n$ must additionally satisfy the condition of being longer than the coherent length of the light of the light source 1.

Typical modulation frequencies $v_n$ as resonant frequencies of piezoelectric crystals are of the order of magnitude of 10 kHz to several 100 kHz. Consequently, a typical pulse duration $\tau$ of a laser pulse of approximately 1 μs is substantially shorter than the period $1/v_n$ and $1/(2v_n)$ of the signals $I_{Det,m,vn}$ and $I_{Det,m,2vn}$. In order to sample one or more periods of the signals $I_{Det,m,vn}$ and $I_{Det,m,2vn}$, there is consequently a need for a correspondingly large number of pulses, and the repetition frequency of the pulses $1/\Delta t$ must differ from $v_n$ and $2v_n$.

Relatively high modulation frequencies $v_n$ in the range from 1 MHz to over 10 MHz can be achieved with integrated optical modulators $PM_n$, for example on lithium niobate substrates, or with the aid of fiber segments that are provided with a piezoelectric coating. One or more periods of the signals $I_{Det,m,vn}$ and $I_{Det,m,2vn}$, can then be sampled within a light pulse.

Figure 3:
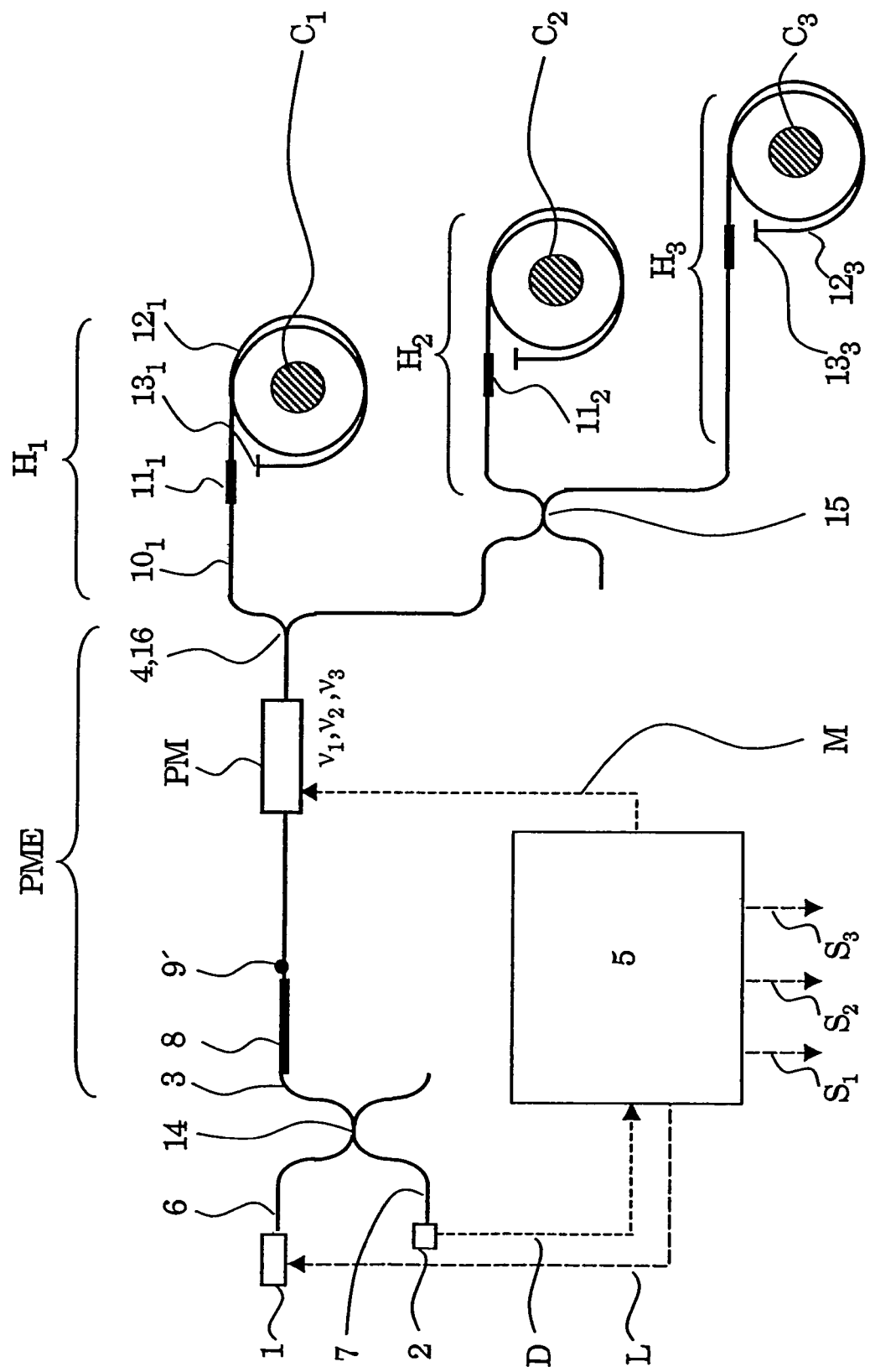
FIG. 3 shows schematically a sensor in reflex configuration, having an integrated optical modulator and three sensor heads.

A further advantageous embodiment of the invention is illustrated in FIG. 3. It corresponds largely to the embodiment illustrated in FIG. 1, and will be described starting therefrom. In essence, here the modulator circuit PME is replaced by a phase modulation unit PME that includes an integrated optical modulator PM as phase modulator PM. The phase modulation unit PME further includes a (single) fiber polarizer 8 that is optically connected to the coupler 14, and a 45° splice 9' arranged between the polarizer 8 and the integrated optical modulator PM. The fiber polarizer 8 serves for linearly polarizing the lightwaves. The 45° splice 9' generates mutually orthogonally polarized lightwaves. The end 4, on the sensor head side, of the phase modulation unit PME is preferably formed by an (asymmetric) 1×2 fiber coupler 16.

Although not illustrated in FIG. 3, it is possible as an alternative for the integrated optical phase modulator PM to be designed in such a way that it not only generates the phase modulation, but also takes over the function of the fiber coupler 16, that is to say splits the lightwaves into two lightwave trains, one for the first sensor head $H_1$, and one for the further two sensor heads $H_2, H_3$.

The only one phase modulator PM requires only one modulator signal line M instead of three modulator signal lines $M_n$.

The control and evaluation unit 5 transmits to the integrated optical modulator PM a modulator signal that permits a simultaneous phase modulation with N different modulation frequencies $v_2$, N=3 in FIG. 3. The modulator signal is then a frequency spectrum or a superposition of the N frequencies $v_n$. The integrated optical phase modulator modulates the phases of mutually orthogonally polarized lightwaves that propagate in the same direction, doing so by direct modulation of the birefringence.

Since, as also in the exemplary embodiment of FIG. 1, only one phase modulation unit PME, by means of which lightwaves from all three sensor heads $H_n$ are phase-modulated, is provided in the exemplary embodiment of FIG. 3, this sensor is also operated in a time division multiplex method, for example with the method described in conjunction with FIGS. 1 and 2.

Figure 4:
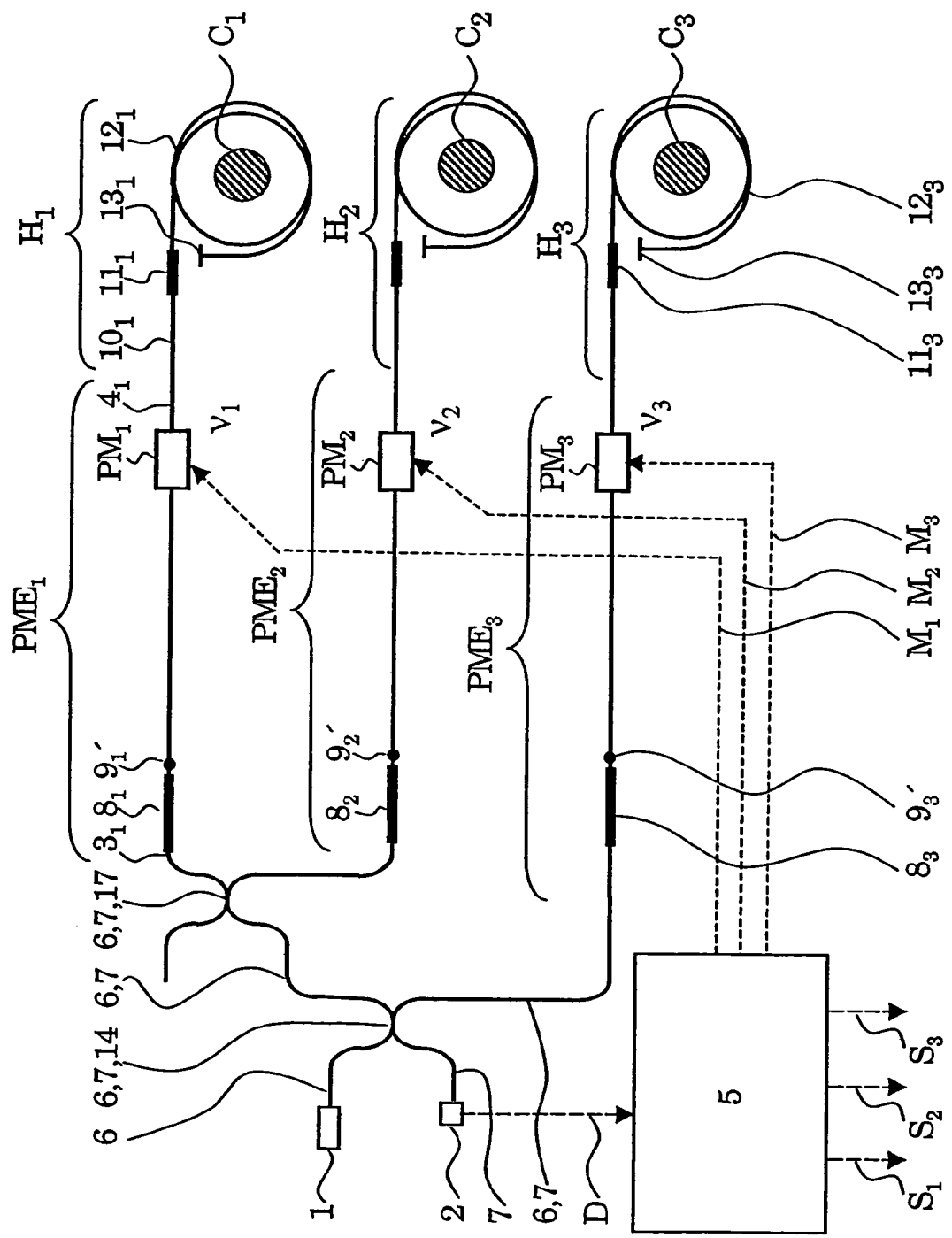
FIG. 4 shows schematically a sensor in reflex configuration, having three integrated optical modulators and three sensor heads.

FIG. 4 shows a further advantageous embodiment of the invention. Once again, this is a sensor having a light source 1, a detector 2, a control and evaluation unit 5 and N=3 sensor heads $H_n$ in reflex configuration. However, the sensor has N=3 phase modulation units PME, having one phase modulator $PM_n$ each. The three sensor heads $H_n$ are of similar design. Their design corresponds to that of the sensor heads described in conjunction with FIG. 1. Each of the three phase modulation units $PME_n$ is of the same design as the phase modulation unit described in conjunction with FIG. 3. Thus, it is possible by means of each of the phase modulators $PM_n$ to modulate the differential phase of mutually orthogonally polarized lightwaves propagating in the same direction. This is performed by means of a direct modulation of the birefringence. The phase modulators $PM_n$ are advantageously designed as integrated optical phase modulators $PM_n$.

Light is guided into each of the three phase modulation units $PME_n$ via first means 6 for guiding light of the light source 1 into the ends $3_n$, on the detector side, of the phase modulation units $PME_N$. These first means 6 include two fiber couplers 14 and 17 and, if appropriate, further fiber pieces. The fiber couplers 14, 17 are advantageously designed in such a way that substantially the same light intensity is coupled into each of the phase modulation units $PME_n$. Each of the phase modulation units $PME_n$ is optically connected at its end $4_n$ on the sensor head side to one sensor head $H_n$ in each case. Light returning from the sensor heads $H_n$ is fed to the detector 2 via second means 7 for guiding light from the ends $4_n$ on the detector side, of the phase modulation units $PME_n$ to the detector 2. These second means 7 include the two fiber couplers 14 and 17 and, if appropriate, further fiber pieces.

In a design in accordance with FIG. 4, the evaluation has no need of a time division multiplexing method, because in the nth phase modulation unit $PME_n$ it is only those lightwaves which have undergone a Faraday phase shift $\Delta\phi_n$ in the nth sensor head $H_n$ that are phase modulated. The signal from the nth sensor head $H_n$ is modulated with the respective modulation frequency $v_n$, and can therefore be uniquely assigned in the control and evaluation unit 5 by assigning the frequencies or by frequency filtering. The light source 1 can be operated in the cw mode, that is to say continuously. A substantially improved signal-to-noise ratio is thereby achieved. A light control signal line L is not required in such a cw operated sensor.

As in the above exemplary embodiments, with a sensor in accordance with FIG. 4 the total optical circulation lengths $\Lambda_n$ are also selected in such a way that disturbing superpositions and reciprocal influences are avoided: The N total circulation lengths $\Lambda_n$ therefore differ from one another by at least the coherence length of the light source 1. Again, the condition is also advantageously satisfied that the term $(\Lambda_n - \Lambda_m) \cdot \Delta n_{gr}$ is substantially greater than the coherence length of the light source 1 for n≠m.

Since one modulation frequency $v_n$ each can be selected per sensor head $H_n$, said frequency can be selected in each case such that an optimum amplitude $\alpha_{0,n}$ is achieved for the modulation of the differential phase, and thus an optimum signal-to-noise ratio is achieved.

Sensors having integrated optical phase modulators are advantageously operated with closed-loop detection. The reciprocal of half the modulation frequency $v_n$ corresponds in this case to the modulation-relevant circulation time $T_n$ of the light, and the Faraday phase shift $\Delta\phi_n$ is compensated at the modulator.

Figure 5:
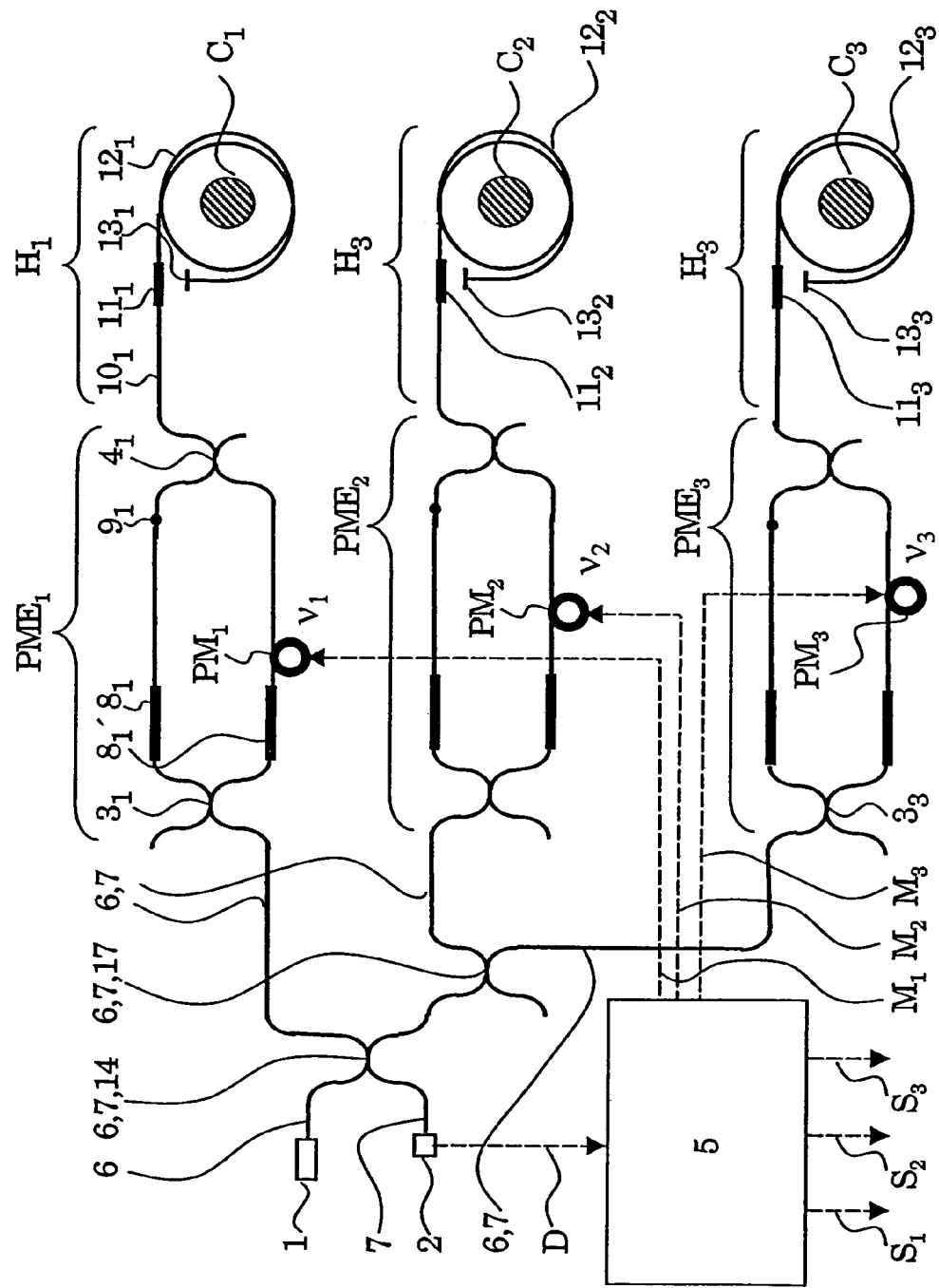
FIG. 5 shows schematically a sensor in reflex configuration, having three modulator circuits with in each case one phase modulator, and having three sensor heads.

FIG. 5 shows a further embodiment, which is similar to the embodiment from FIG. 4 and is described starting therefrom. Instead of the phase modulation units $PME_n$ having integrated optical phase modulators $PM_n$, modulator circuits $PME_n$ having piezoelectric phase modulators $PM_n$ are provided in FIG. 5 as phase modulation units $PME_n$. The modulator circuits $PME_n$ are described in conjunction with FIG. 1 and in the abovementioned EP 1 154 278 A2. Each of the phase modulators $PM_n$ modulates the differential phase of two lightwaves propagating in opposite directions to one another and polarized parallel to one another.

Figure 6:
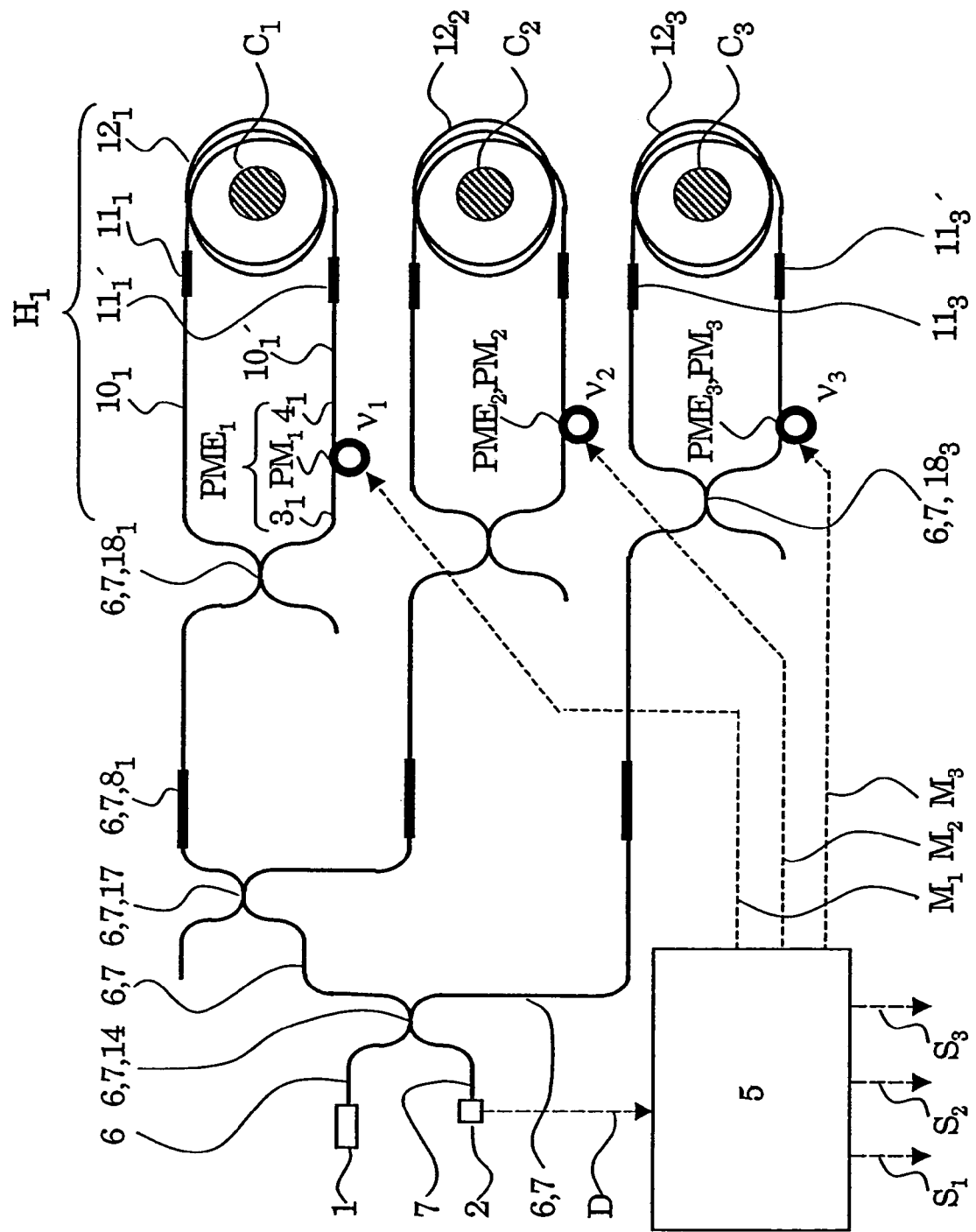
FIG. 6 shows schematically a sensor in Sagnac configuration, having three piezoelectric phase modulators and three sensor heads.

FIG. 6 shows a current sensor with N=3 sensor heads $H_n$ in Sagnac configuration. Thus, together with a part of the residual optical structure of the sensor, the three sensor heads $H_n$ each form a Sagnac interferometer. The design is described starting from the design in FIG. 4. By contrast with FIG. 4, in FIG. 6 the three phase modulation units $PME_n$, the three sensor heads $H_n$ and the means 6, 7 for guiding light are designed in a different way. The sensor heads $H_n$ have two feeder fibers $10_n$, $10_n'$ and no mirrored end. Each of the phase modulation units $PME_n$ consist essentially of one phase modulator $PM_n$ each, which can be, for example, an integrated optical phase modulator $PM_n$ or, as illustrated in FIG. 6, a piezoelectric phase modulator $PM_n$. The fiber polarizers $8_n$, which are part of the means 6, 7 for guiding light, are not followed by a turned splice, but by a simple, non-rotated splice, which is therefore not illustrated. The first means 6 and second means 7 include fiber couplers $18_n$. The feeder fiber $10_n$ of the sensor head $H_n$ is directly connected optically to one of the output ends, on the sensor head side, of the coupler $18_n$. The other output end, on the sensor head side, of the coupler $18_n$ is optically connected to the phase modulation unit $PME_n$ or the phase modulator $PM_n$, respectively. The phase modulation unit $PME_n$ is optically connected, in turn, to the feeder fiber $10_n'$ of the sensor head $H_n$. It holds advantageously for a spacing $\delta$ of the phase modulator $PM_n$ of the coupler $18_n$ that $\Delta n_{gr}\cdot\delta$ is smaller than the coherence length of the light of the light source 1, $\Delta n_{gr}$ being the difference between the group refractive indices for the two mutually orthogonal light modes.

In the case of such a sensor with Sagnac configuration, lightwaves propagating in opposite directions and polarized parallel to one another are phase-modulated by each of the N phase modulators $PM_n$.

Figure 7:
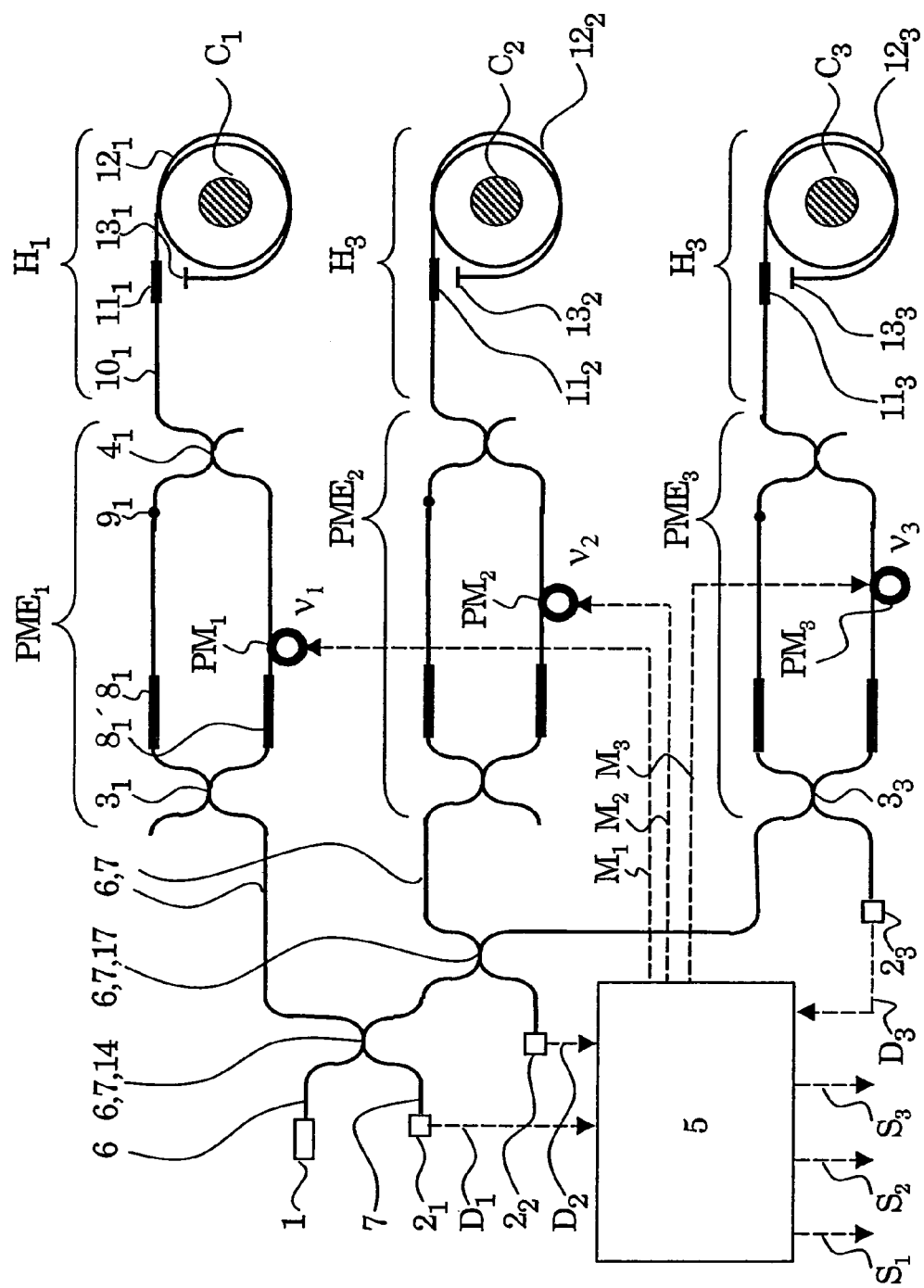
FIG. 7 shows schematically a sensor in reflex configuration, having three modulator circuits with in each case one phase modulator, having three sensor heads and having three detectors.

FIG. 7 shows a further advantageous embodiment of the invention. This sensor resembles the sensor illustrated in FIG. 5 and is described starting therefrom. Instead of a detector 2, the sensor in accordance with FIG. 7 has N=3 detectors $2_n$. These are arranged in each case on an arm, averted from the respective sensor head $H_n$, of the couplers 14, 17 and $3_3$. Each detector $2_n$ is connected via a detector signal line $D_n$ to the control and evaluation unit 5. Each of the three detectors $2_n$ serves for detecting the signals originating from the respective sensor head $H_n$. The corresponding lightwaves therefore pass fewer couplers by comparison with a design in accordance with FIG. 5. Consequently, less loss in intensity occurs, and higher optical powers can be detected. This leads to a better signal-to-noise ratio. Again, the other embodiments discussed can also be provided in a similar way with N detectors $2_n$.

In order to achieve a virtually perfect reciprocity, and thus stability of the sensors when taking measurements, the detectors $2_n$ are arranged on the said couplers. The detectors $2_1$ and $2_2$ are arranged in FIG. 7 at a reciprocal output, not so, however, the detector $2_3$. An alternative design (not illustrated) in which more light power can be detected results when, by analogy with the detector $2_3$, each of the detectors $2_n$ is arranged at the respective coupler $3_n$, each of the detectors $2_n$ then being arranged at a non-reciprocal output.

In the case of the modulation circuits $PME, PME_n$, the means for changing the direction of polarization 9 can be arranged without any, with one or with several phase modulators $PM, PM_n$ in the same fiber branch. When several phase modulators are arranged in one modulation circuit, these can be distributed alternately over the two fiber branches. It is also possible in a modulator circuit for two or more phase modulators operated with the same frequency $v_n$ to replace a single phase modulator operated with this frequency $v_n$. These phase modulators can be arranged in the same or in different fiber branches of the modulator circuit.

Instead of only one phase modulator $PM_n$, it could also be possible for several phase modulators $PM_n$ per sensor head $H_n$ to be arranged in a design with Sagnac configuration such as in FIG. 6, for example. An arrangement at the same or different ends of the respective sensor coil $12_n$ would be possible.

In principle, in the exemplary embodiments discussed the divider ratios of the couplers are advantageously selected in such a way that substantially the same light intensity is coupled into each sensor head $H_n$.

In principle, in the exemplary embodiments discussed the number and arrangement of the couplers is advantageously selected in such a way that the reciprocity obtains for all light paths. This means that no non-reciprocal phase shifts occur owing to the design of the sensor, but only the non-reciprocal Faraday phase shift $\Delta\phi_n$ to be detected, and the quasi static phase shift, caused by the phase modulation, for the effective shifting of the operating point during detection and evaluation. For example, the design in accordance with FIG. 1 would no longer be reciprocal, and thus vulnerable to disturbing influences (mechanical, thermal), were the two couplers 14 and 3 to be replaced by a single coupler.

It is also possible in principle to make use instead of two serially connected couplers of a single coupler that couples one or two light paths into more than two light paths. For example, in FIG. 1 the couplers 4 and 15 would correspondingly be replaced by a 2×3 coupler, which has two inputs and three outputs, in which case one sensor head $H_n$ would be coupled to each of the three outputs via one optical supply lead $10_n$ each. However, this entails an adequate maintenance of the polarization of the coupler.

Of course, various types of the phase modulation units PME described and the phase modulators PM can be combined in a sensor. Moreover, it is also possible to conceive of phase modulators that differ from piezoelectric and integrated optical phase modulators.

It is advantageous of the sensors described that they require only a single control and evaluation unit 5, and only a single signal processor. It is further advantageous that only a single light source 1 is required. It is further advantageous that it is possible to manage with only a single detector 2. All of these advantages result in a simple and cost effective design of the sensor.

Sensors according to the invention can be used to measure N currents or N magnetic fields. It is also possible to use some of the sensor heads $H_n$ redundantly. For example, in the case of N=6 sensor heads $H_n$, it is advantageously possible for two sensor heads in each case to measure the same current of a phase of an electric high voltage system. One of the two sensor heads advantageously has more turns of the sensor coil, and serves the purpose of exact current measurement, for example for power billing, while the other sensor head with fewer turns has a larger measuring range and is used for the purpose of power system protection, it being possible to use it to measure overcurrents unambiguously in the case of a short circuit.

Two further methods are described below, and these can be used to achieve a good signal-to-noise ratio with the aid of only one phase modulator PM and only one modulation frequency v in a time division multiplexing method by virtue of the fact that the amplitude $\alpha_{0,n}$ of the differential phase can be set optimally for each of the N sensor heads (compare the designs of FIGS. 1 and 3):

This can be achieved by a suitable selection of the differences between the various overall optical circulation lengths $\Lambda_n$ from the light source through the nth sensor head to the detector. The amplitude $\alpha_{0,n}$ of the nearest sensor head (smallest $\Lambda_n$), for example, is selected optimally by appropriate selection of the overall circulation length $\Lambda_n$. This means that this is $\alpha_{0,n}=1.84$ in the case of detection at the first and second harmonics. The equation already mentioned $$\alpha_{0,n}=2\cdot\phi_{0,n}\cdot\sin(2\pi v T_n/2)$$

can now be used to select the segment increment relating to the next longest total optical circulation length $\Lambda_n$ such that the argument of the sine term changes by $\pi$:

$$2\pi v_n \Delta T/2 = 2\pi v \Delta \Lambda/c = \pi$$

and thus $$\Delta \Lambda = c/2v,$$

$\Delta\Lambda$ being the segment increment by which the minimum total optical circulation length $\Lambda_n$ must be extended in order to achieve the change by $\pi$, and $\Delta T$ being the corresponding minimum extension of the circulation time of the light. If the further total optical circulation lengths $\Lambda_n$ are increased by a multiple of $\Delta\Lambda$ by comparison with the smallest $\Lambda_n$, the detection is possible for all sensor heads having an optimum signal-to-noise ratio. $\Delta\Lambda=796$ m for a modulation frequency of 130 kHz. The higher the modulation frequency v is selected, the smaller is the required fiber length.

The second possibility of setting the amplitude $\alpha_{0,n}$ to its optimum value (for example 1.84) by using only one phase modulator PM and only one modulation frequency v in the time division multiplexing method for all the sensor heads $H_n$ consists in making a suitable selection of the amplitude of the phase modulation $\phi_{0,n}$ in appropriate time windows by means of a suitable selection of the driver voltage of the phase modulator PM. Thus (compare FIG. 2), when a signal originating from the first sensor head $H_1$ is detected starting from the time $\Delta\tau_1$ after the beginning of a light pulse from the light source 1, the amplitude $\phi_{0,1}$ of the phase modulation is selected in such a way that $\alpha_{0,1}$ is optimum. When a signal originating from the second sensor head $H_2$ is detected starting from the time $\Delta\tau_2$ after the beginning of a light pulse from the light source 1, the amplitude $\phi_{0,2}$ of the phase modulation is to be selected in such a way that $\alpha_{0,2}$ is optimum, in which case $\alpha_{0,1}$ and $\alpha_{0,2}$ and the corresponding driver voltages and $\phi_{0,1}$ and $\phi_{0,2}$ are generally of different magnitude. Note that in the case of low modulation frequencies v the time required to change the amplitudes $\phi_{0,n}$ of the phase modulation can be substantially longer than the repetition frequency of the light pulse $1/\Delta t$. The gaining of signals is interrupted during this dead time in which the amplitude is changed, and so a worsened signal-to-noise ratio results.

LIST OF REFERENCE SYMBOLS

1 light source
2, $2_n$ detector, photodiode
3, $3_n$ end, on the detector side, of the phase modulation unit; fiber coupler
4, $4_n$ end, on the sensor head side, of the phase modulation unit; fiber coupler
5 control and evaluation unit: signal processor
6 first means (for guiding light of the light source into an end, on the detector side, of the phase modulation unit)
7 second means (for guiding light from the end, on the detector side, of the phase modulation unit to the detector)
8, $8_n$ polarizer, fiber polarizer
8', $8_n'$ polarizer, fiber polarizer
9, $9_n$ means for changing the direction of polarization, 90° splice
9', 9n' means for changing the direction of polarization, 45° splice
$10_n$ fiberoptic supply lead
$11_n, 11_n'$ phase delay element, $\lambda/4$ element
$12_n$ sensor coil, magnetooptically active fiber
$13_n$ mirror, mirrored end
14 fiber coupler
15 fiber coupler
16 fiber coupler
17 fiber coupler
$18_n$ fiber coupler
$C_n$ current conductor
D, $D_n$ detector signal line
$H_n$ sensor head
$I_{el,n}$ electric current to be measured
$l_n$ modulation-relevant optical path length
L light control signal line
M, $M_n$ modulator signal line
N whole number with $N \geq 2$; number of sensor heads
$\Delta n_{gr}$ difference between the group refractive indices for the two mutually orthogonal light modes
p positive whole number
PM, $PM_N$ phase modulator, piezoelectric modulator, integrated optical modulator
PME, $PME_n$ phase modulation unit, modulator circuit
q positive whole number
$S_n$ output signal
$T_n$ modulation-relevant circulation time
$\Delta t$ light pulse spacing
V Verdet constant (of a sensor coil)
$\alpha_{o,n}$ amplitude of the modulation of the differential phase
$\delta$ spacing (of the phase modulator from the coupler in the Sagnac configuration)
$\Delta\phi_n$ differential phase shift on the basis of the Faraday effect
$\Lambda_n$ total optical circulation length (from the light source 1 through the nth sensor head to the nth detector)
$v_n$ modulation frequency
$\phi_{0,n}$ amplitude of the phase modulation
$\tau$ pulse duration (of a light pulse in the case of time division multiplexing)
$\Delta\tau_n$ transit time of a light pulse from the light source to the detector

The invention claimed is:

1. A fiberoptic sensor for measuring at least one electric current or magnetic field, having
 a light source,
 N sensor heads that can be arranged in the shape of a coil around current conductors or along the magnetic field, N being a whole number with N≧2; exactly one phase modulation unit, having at least one phase modulator;
 at least one detector;
 a control and evaluation unit that is connected via at least one detector signal line to the at least one detector, and via at least one modulator signal line to the at least one phase modulator;
 first means being provided for guiding light from the light source into an end, on the detector side, of the phase modulation unit;
 second means being available for guiding light from the end, on the detector side, of the phase modulation unit to the detector;
 wherein the phase modulation unit has a further end, on the sensor head side, that is optically connected to at least one of the N sensor heads, and
N reflection interferometers are provided, each of the N reflection interferometers includes exactly one of the N sensor heads, and the N sensor heads in each case having a mirrored end, and
 wherein by means of the phase modulation unit linearly polarized lightwaves can be phase-modulated differentially in a non-reciprocal fashion, wherein N modulation amplitudes $\phi_{0,n}$ and N modulation frequencies $v_n$ are provided for the non-reciprocal differential phase modulations, the modulation frequencies $v_n$ and two prescribable positive whole numbers p, q with p≠q being selected in such a way that the following equation is fulfilled for all positive whole numbers z and for all whole numbers n, m with n≠m and 1≦n,m≦N that:

$p \times v_n \neq z \times v_m$ and $q \times v_n \neq z \times v_m$ and the modulation amplitudes $\phi_{0,n}$ and the modulation frequencies $v_n$ being selected as a function of modulation-relevant optical path lengths $l_n$.

2. The sensor as claimed in claim 1, wherein exactly one control and evaluation unit is provided, in which signals that originate from the various sensor heads and are fed to the control and evaluation unit via the at least one detector signal line can be distinguished from one another by means of frequency filtering, it being possible to convert these signals into N output signals $S_n$, in particular it being possible to determine the output signals $S_n$ for each n with 1≦n≦ N from signals at the frequencies $p \times v_n$ and $q \times v_n$ in the control and evaluation unit.

3. The sensor as claimed in claim 1, wherein the light source is connected to the control and evaluation unit via a light control signal line, and in that a time division multiplexing method is provided for the measurement.

4. The sensor as claimed in claim 1, wherein the phase modulation unit either (a) is a modulator circuit having N phase modulators, in particular piezoelectric phase modulators, each of the N phase modulators being assigned to exactly one of the N modulation frequencies $v_n$, and wherein each of the N phase modulators can be operated at the modulation frequency $v_n$ assigned to it, and wherein the differential phase of oppositely directed lightwaves polarized parallel to one another can be modulated, or (b) includes a single phase modulator, configured as an integrated optical phase modulator, which permits a simultaneous phase modulation with the N various modulation frequencies $v_n$, and it being possible to modulate the differential phase of lightwaves that propagate in the same direction and are mutually orthogonally polarized.

5. The sensor as claimed in claim 4, wherein
selection p=1 and q=2 is made, wherein the N modulation amplitudes $\phi_{0,n}$ and the N modulation frequencies $v_n$ are selected in such a way that amplitudes $\alpha_{0,n}$ of the modulation of the differential phase of the linearly polarized lightwaves lie between 1.7 and 2.0, in particular between 1.8 and 1.88, or are essentially 1.84 for all n with 1≦n≦N.

6. The sensor as claimed in claim 5, wherein either
(a) exactly one detector is provided, or
(b) N detectors are provided, each of the detectors being connected to the control and evaluation unit via one detector signal line each.

7. A fiberoptic sensor for measuring at least one electric current or magnetic field, comprising:
 a light source;
 N sensor heads that can be arranged in the shape of a coil around current conductors or along the magnetic field, N being a whole number with N≧2;
 at least one phase modulation unit, having at least one phase modulator;
 at least one detector:
 a control and evaluation unit that is connected via at least one detector signal line to the at least one detector, and via at least one modulator signal line to the at least one phase modulator;
 first means being provided for guiding light from the light source into an end on the detector side, of the phase modulation unit;
 second means being available for guiding light from the end, on the detector side, of the phase modulation unit to the detector the at least one phase modulation unit having a further end, on the sensor head side, that is optically connected to at least one of the sensor heads, and
 wherein N phase modulation units having one phase modulator each are provided, the nth phase modulation unit being optically connected to the nth sensor head, and it being possible to operate the nth phase modulator with the modulation frequency $v_n$, and each of the phase modulators being connected to the control and evaluation unit via one modulator signal line each, and
 wherein by means of the at least one phase modulation unit linearly polarized lightwaves can be phase-modulated differentially in a non-reciprocal fashion, wherein N modulation amplitudes $\phi_{0,n}$ and N modulation frequencies $v_n$ are provided for the non-reciprocal differential phase modulations, the modulation frequencies $v_n$ and two prescribable positive whole numbers p, q with p≠q being selected in such a way that the following equation is fulfilled for all positive whole numbers z and for all whole numbers n, m with n≠m and 1≦n,m≦N that:

$p \times v_n \neq z \times v_m$ and $q \times v_n \neq z \times v_m$, and the modulation amplitudes $\phi_{0,n}$ and the modulation frequencies $v_n$ being selected as a function of modulation-relevant optical path lengths $l_n$.

8. The sensor as claimed in claim 7, wherein N reflection interferometers are provided, each of the N reflection interferometers comprising exactly one of the N sensor heads, and the N sensor heads in each case having a mirrored end, and wherein either
  (a) the phase modulation units are modulator circuits, and wherein it is possible to modulate the differential phase of oppositely directed lightwaves polarized parallel to one another by means of the phase modulators, and wherein the phase modulators are piezoelectric phase modulators, or
  (b) each of the phase modulators can modulate the differential phase of mutually orthogonally polarized lightwaves propagating in the same direction and, wherein the phase modulators are integrated optical phase modulators.

9. The sensor as claimed in claim 7, wherein N Sagnac interferometers are provided, each of the N Sagnac interferometers including exactly one of the N sensor heads, and
  wherein each of the phase modulation units is essentially one phase modulator each, it being possible to modulate the differential phase of oppositely directed lightwaves, polarized parallel to one another, by means of the phase modulators, and
  wherein the phase modulators are piezoelectric phase modulators or integrated optical modulators.

10. The sensor as claimed in claim 9, wherein selection p=1 and q=2 is made, and in that the N modulation amplitudes $\phi_{0,n}$ and the N modulation frequencies $v_n$ are selected in such a way that amplitudes $\alpha_{0,n}$ of the modulation of the differential phase of the linearly polarized lightwaves lie between 1.7 and 2.0, in particular between 1.8 and 1.88, or are essentially 1.84 for all n with $1 \leq n \leq N$.

11. The sensor as claimed in claim 10, wherein either
  (a) exactly one detector is provided, or
  (b) N detectors are provided, each of the detectors being connected to the control and evaluation unit via one detector signal line each.

12. A fiberoptic sensor for measuring at least one electric current or magnetic field comprising:
  a light source;
  N sensor heads that can be arranged in the shape of a coil around current conductors or along the magnetic field, N being a whole number with $N \geq 2$, wherein when N=3 or N=6, and the electric currents of three phases of an electric high voltage system can be measured by means of one sensor head each in the case of N=3, or being able to be measured by means of two sensor heads each in the case of N=6;
  at least one phase modulation unit, having at least one phase modulator,
  at least one detector;
  a control and evaluation unit that is connected via at least one detector signal line to the at least one detector, and via at least one modulator signal line to the at least one phase modulator;
  first means being provided for guiding light from the light source into an end, on the detector side, of the phase modulation unit;
  second means being available for guiding light from the end, on the detector side, of the phase modulation unit to the detector, the at least one phase modulation unit having a further end, on the sensor head side, that is optically connected to at least one of the sensor heads, and
  wherein by means of the at least one phase modulation unit linearly polarized lightwaves can be phase-modulated differentially in a non-reciprocal fashion, wherein N modulation amplitudes $\phi_{0,n}$ and N modulation frequencies $v_n$ are provided for the non-reciprocal differential phase modulations, the modulation frequencies $v_n$ and two prescribable positive whole numbers p, q with p≠q being selected in such a way that the following equation is fulfilled for all positive whole numbers z and for all whole numbers n, m with n≠m and $1 \leq n,m \leq N$ that:

$p \times v_n \neq z \times v_m$ and $q \times v_n \neq z \times v_m$ and the modulation amplitudes $\phi_{0,n}$ and the modulation frequencies $v_n$ being selected as a function of modulation-relevant optical path lengths $l_n$.

* * * * *